(12) United States Patent
Park

(10) Patent No.: US 8,048,592 B2
(45) Date of Patent: Nov. 1, 2011

(54) PHOTOMASK

(75) Inventor: Dae Jin Park, Icheon-si (KR)

(73) Assignee: Hynix Semiconductor Inc., Icheon (KR)

( * ) Notice: Subject to any disclaimer, the term of this patent is extended or adjusted under 35 U.S.C. 154(b) by 67 days.

(21) Appl. No.: 12/494,234

(22) Filed: Jun. 29, 2009

(65) Prior Publication Data

US 2010/0209824 A1 Aug. 19, 2010

(30) Foreign Application Priority Data

Feb. 17, 2009 (KR) .................. 10-2009-0012855

(51) Int. Cl.
*G03F 1/00* (2006.01)
(52) U.S. Cl. ......................................... 430/5

(58) Field of Classification Search ............... 430/5, 394
See application file for complete search history.

(56) References Cited

U.S. PATENT DOCUMENTS

| 7,214,453 B2 * | 5/2007 | Yamazoe et al. ................ 430/5 |
| 2006/0078806 A1 * | 4/2006 | Hansen ........................... 430/5 |

FOREIGN PATENT DOCUMENTS

| JP | 07-146545 | 6/1995 |
| KR | 1020040070801 A | 8/2004 |

\* cited by examiner

*Primary Examiner* — Stephen Rosasco

(57) ABSTRACT

A photomask that includes an assistant pattern is provided. The photomask comprises a target pattern transcribed over a wafer by an exposing process, and an assistant pattern formed symmetrically with a main pattern of the target pattern based on the outer pattern of the target pattern, thereby minimizing the loss of the outer pattern and maximizing the process margin in the defocus environment.

14 Claims, 7 Drawing Sheets

(a)

(b)

PHOTOMASK

CROSS-REFERENCE TO RELATED APPLICATION

The priority of Korean patent application No. 10-2009-0012855 filed Feb. 17, 2009, the disclosure of which is hereby incorporated in its entirety by reference, is claimed.

BACKGROUND OF THE INVENTION

The present invention relates to a photomask used in an exposing process for manufacturing a semiconductor device, and more specifically, to a photomask that includes an assistant pattern formed in an open region around the main pattern.

In photolithography for manufacturing a semiconductor device, a photomask is used to form a pattern on a semiconductor substrate. The photomask has a mask pattern for forming various components of the semiconductor device. As the semiconductor device becomes more integrated, the feature size of the mask pattern becomes smaller.

When the feature size of the mask pattern reaches a resolution limit of an exposer, it becomes difficult to transfer a desired pattern on a substrate due to the optical proximity effect.

That is, when the mask pattern is transferred on a substrate by illumination of exposure sources (e.g., KrF excimer laser or ArF excimer laser), the pattern formed on the photomask is not transferred to the substrate uniformly. The pattern is distorted depending on the its location of the pattern. When the light transmitted by a light source passes through the photomask, various optical phenomena occur depending on the location and the shape of the mask pattern so that the light intensity varies depending on the location on the photomask.

In order to solve the above problem, an optical proximity correction (OPC) technology has been used.

The OPC is to calculate statistically or experimentally a relation between an intended pattern and an actual pattern formed in photoresist. The size and shape of the mask pattern can then be adjusted depending on the calculation.

However, when a conventional OPC is used, it is difficult to improve the margin of the depth of focus and the uniformity of a critical dimension (CD) in all of the patterns of the chip. A pattern formed at an outer edge of a cell array is particularly vulnerable to defocus.

FIG. 1 is a diagram illustrating a SEM photograph of contact holes formed in a cell array region when optical proximity correction is performed without an assistant pattern.

Referring to FIG. 1, a contact hole pattern disposed in the outer edge is distorted due to the defocus phenomenon. FIG. 1 shows how the defocus phenomenon changes in the outer edge pattern as the depth of focus changes from −0.2 μm to −0.04 μm.

FIG. 2 is a diagram illustrating an aerial image of the contact hole pattern of FIG. 1 with the best focus.

As shown in an aerial image 12 disposed between contact holes 11 of FIG. 2, when defocus occurs, likelihood of generating bridges between the adjacent contact holes 11 increases significantly.

In order to prevent the generation of bridges, a method of enlarging a hole diameter of the outer edge pattern has been used. However, when the diameter of the contact hole is enlarged, a contact region encroaches into a gate region and may cause a short between the two regions. As a result, the method of enlarging a hole diameter of the outer edge pattern has a limit.

Alternatively to the solution above, a method of inserting an assistant pattern into a photomask may be used. However, it is difficult to obtain a desired outer pattern and a desired process margin by this method.

As a result, a new assistant pattern is required to obtain a desired process margin for forming the outer pattern, which is most vulnerable to the defocus phenomenon.

BRIEF SUMMARY OF THE INVENTION

Various embodiments of the invention are directed to providing a photomask that comprises an assistant pattern formed symmetrically with a main pattern with the same pitch.

According to an embodiment of the present invention, a photomask comprises: a target pattern transferred over a substrate by photolithography; and an assistant pattern formed symmetrically with a main pattern of the target pattern based on the outer pattern of the target pattern.

The assistant pattern is formed symmetrically with the main pattern, thereby improving the process margin of the outer pattern as well as the main pattern and reducing the loss of the outer pattern in a defocus environment.

Preferably, the assistant pattern has the same pitch as that of the main pattern. The assistant pattern is formed to have the same pitch as that of the main pattern and to be symmetrical with the main pattern, thereby reducing the loss of the outer pattern in the defocus environment.

Preferably, the assistant pattern includes first lines and second lines that form a net shape. The first lines have a slope that is substantially the same as a slope of a first set of the main pattern and the second lines have a slope that is substantially the same as a slope of a second set of the main pattern.

Preferably, the assistant pattern is formed to have the same distance between the adjacent crossed points of the first lines and the second lines as the pitch of the main pattern. The assistant pattern has the same X direction pitch as Y direction pitch between the adjacent points.

Preferably, the assistant pattern includes a chrome (Cr) film, a molybdenum (Mo) film and a stacked structure thereof.

Preferably, the assistant pattern is a brick wall shaped pattern in an open region adjacent to the outer pattern.

Preferably, the main pattern and the outer pattern are contact hole patterns formed repeatedly with a given interval in a cell array region. The target pattern is an optical-proximity-corrected pattern. The outer pattern has a critical dimension larger than that of the main pattern

BRIEF DESCRIPTION OF THE DRAWINGS

FIG. 5a is a graph illustrating the intensity of light irradiated along A-A' in the aerial image of FIG. 4a.

FIG. 6 is a diagram illustrating the aerial image around the outer pattern in FIG. 4a.

DESCRIPTION OF EMBODIMENTS

Figure 3:
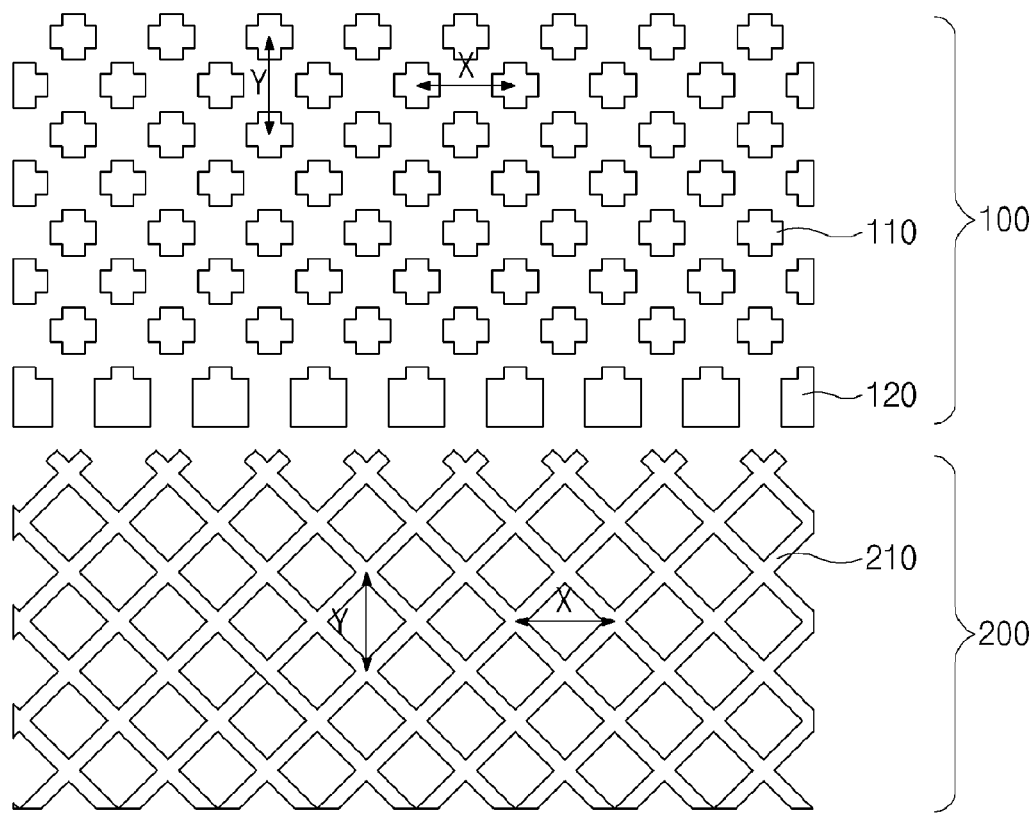
FIG. 3 is a diagram illustrating a layout of a photomask according to an embodiment of the present invention.

FIG. 3 is a diagram illustrating a layout of a photomask according to an embodiment of the present invention.

The photomask of FIG. 3 comprises a target pattern 100 and an assistant pattern 200 which are formed over a transparent substrate (not shown).

The target pattern 100 a pattern to be transferred to a photoresist film by photolithography. In the present embodiment, the target pattern 100 is a pattern for contact holes to be formed in a cell array region. The target pattern 10 of FIG. 3 shows a pattern shape obtained by performing an optical proximity correction on the contact hole pattern formed with a given pitch in the cell array region. A pattern 120 formed on the outside edge of the target pattern 100 (hereinafter, referred to as "outer pattern") is a dummy pattern for improving a process margin of a main pattern 110. The outer pattern 120 is formed to have a hole diameter larger than that of the main pattern 110.

The assistant pattern 200 is formed on the photomask, but does not get transferred to the photoresist. The assistant pattern 200 is formed in an unused region (open region) next to the outer pattern 120, thereby maximizing the optical effect of the target pattern 100 to improve the process margin of the target pattern 100. The assistant pattern 200 is formed to have a critical dimension smaller than a resolution of an illuminator used in an exposing process, so that so that the assistant pattern 200 is not transferred to the photoresist during the photolithography process. The assistant pattern 200 is formed "symmetrically" with (or to resemble) the main pattern 110 with the the outer pattern 120 as a reference line. This is done in order to improve the process margin of the target pattern 100, particularly, the outer pattern 120. As used herein, the term "symmetrical" or "symmetrically" refers the patterns that have the same X-direction and Y-direction pitches. In the present embodiment, the assistant pattern 200 and the main pattern 110 have the same pitch for their respective iterations of shapes. The assistant pattern 200 is preferably formed in a region of larger than 1 μm from the outer pattern 120.

The assistant pattern 200 includes line patterns 210 arranged in parallel to the contact hole patterns of the main pattern 110. The line patterns 210 cross each other diagonally to create a net shape. In the assistant pattern 200 of FIG. 3, distances between points where the lines intersect [i.e., a X direction pitch (X') and a Y direction pitch (Y')] are formed to be the same as a X direction pitch (X) and a Y direction pitch (Y) of the main pattern 110. Although FIG. 3 shows the pitch X' is formed to be the same as the pitch Y', they may be different from each other depending on the shape of the main pattern 110.

The target pattern 100 and the assistant pattern 200 may be formed, respectively, of a chrome (Cr) film, a molybdenum (Mo) film and a stacked structure thereof.

Figure 4A:
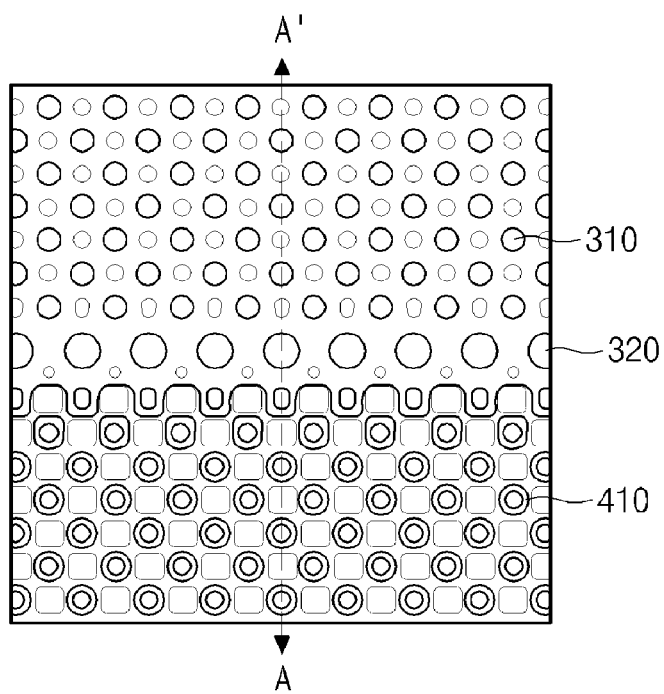
FIG. 4a is a diagram illustrating an aerial image when an exposing process is performed with a photomask that comprises an assistant pattern according to an embodiment of the present invention.
Figure 4B:
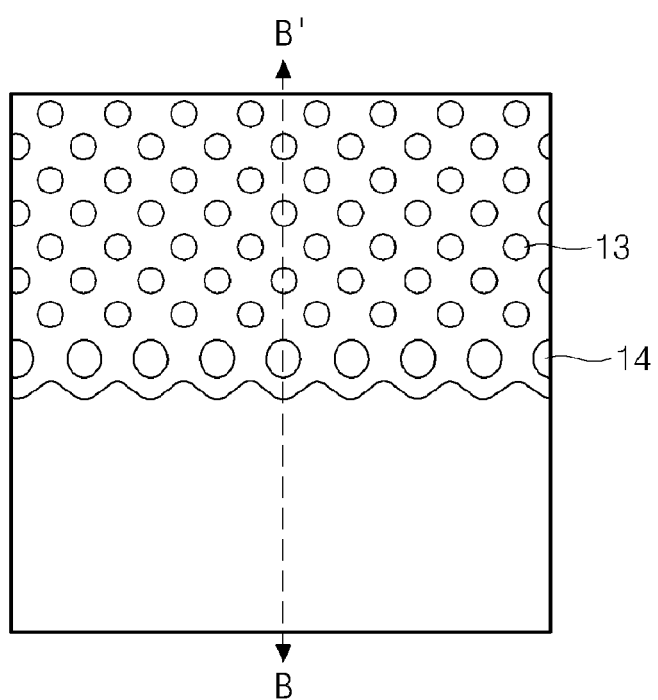
FIG. 4b is a diagram illustrating an aerial image when an exposing process is performed with a photomask that does not comprise an assistant pattern according to an embodiment of the present invention.

FIG. 4a is a diagram illustrating an aerial image when an exposing process is performed with a photomask that includes an assistant pattern according to an embodiment of the present invention. FIG. 4b is a diagram illustrating an aerial image when an photolithography is performed with a photomask that does not include an assistant pattern according to an embodiment of the present invention.

The comparison of the aerial images of FIGS. 4a and 4b is as follows.

Referring to FIG. 4b, an aerial image of the main pattern 13 and an aerial image of the outer pattern 14 are formed. Referring to FIG. 4a, an aerial image 410 symmetrical with the aerial image 310 of the main pattern is formed in an open region outside of the outer pattern. That is, although the assistant pattern 210 is not transferred onto the semiconductor substrate, the aerial image 410 symmetrical with the aerial image 310 is formed in the open region based on the aerial image of the outer pattern 320.

Figure 5A:
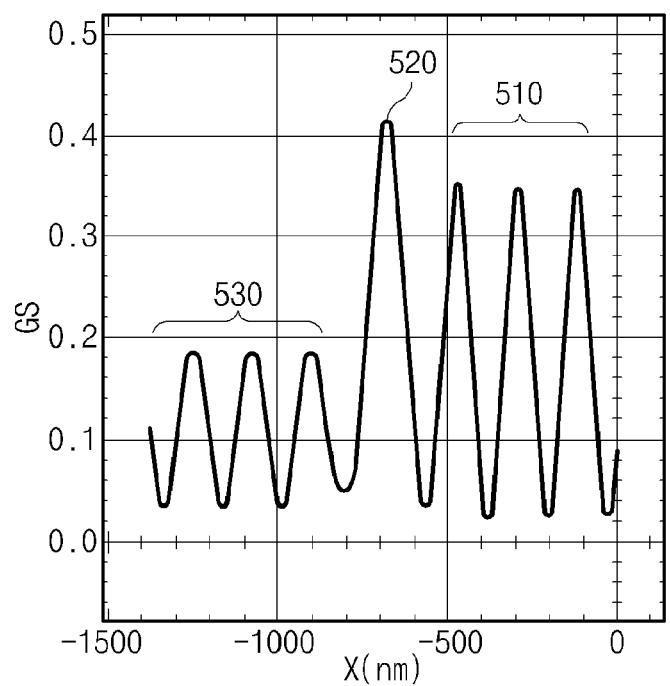
Figure 5B:
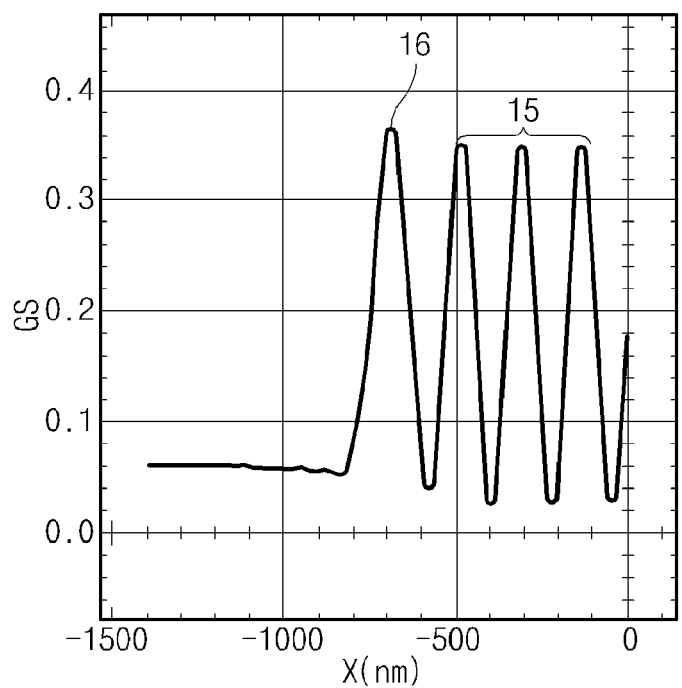
FIG. 5b is a graph illustrating the intensity of light irradiated along B-B' in the aerial image of FIG. 4b.

FIG. 5a is a graph illustrating the intensity of light irradiated along A-A' in FIG. 4a, and FIG. 5b is a graph illustrating the intensity of light irradiated along B-B' in FIG. 4b.

FIG. 5b shows main peaks 15 and an outer peak 16 corresponding respectively to a point where a main pattern 13 is supposed to form and a point where an outer pattern 14 is supposed to form, but no aerial image peak exists in the open region. The outer peak 16 has about the same height as the main peak 15, so that their peak values are similar to each other. It is difficult to improve the process margin of the outer pattern 120 in the exposing process.

On the other hand, FIG. 5a shows an assistant peaks 530 that have a similar shape to that of the main peak 510 although the peak value of the assistant peak 530 is small. That is, the assistant peaks 530 corresponding to the assistant pattern 200 are symmetrical with the main peaks 510 of the main pattern 110 with respect to the outer peak 520 of the outer pattern 120 as a centerline (or a reference). The value (i.e., 0.42) of the outer peak 520 corresponding to the outer pattern 120 is significantly larger than the value (i.e., 0.35) of the main peak 510. As shown in FIG. 5a, the formation of the assistant pattern 200 increases the value of the outer peak 520 of the outer pattern 120.

In other words, the assistant pattern 200 that has the same pitch as that of the main pattern 110 is formed to be symmetrical with the main pattern 110, thereby increasing the difference between the light intensity for the main pattern 110 and the assistant pattern 200. As a result, the value of the outer peak 520 of the outer pattern 120 disposed between the main pattern 110 and the assistant pattern 200 is increased.

In this way, the increase of the outer peak 520 also increases the process margin of the outer pattern 120. The outer pattern 120 is thereby made resistant to the defocus phenomenon and is formed to have a desired shape.

Figure 6:
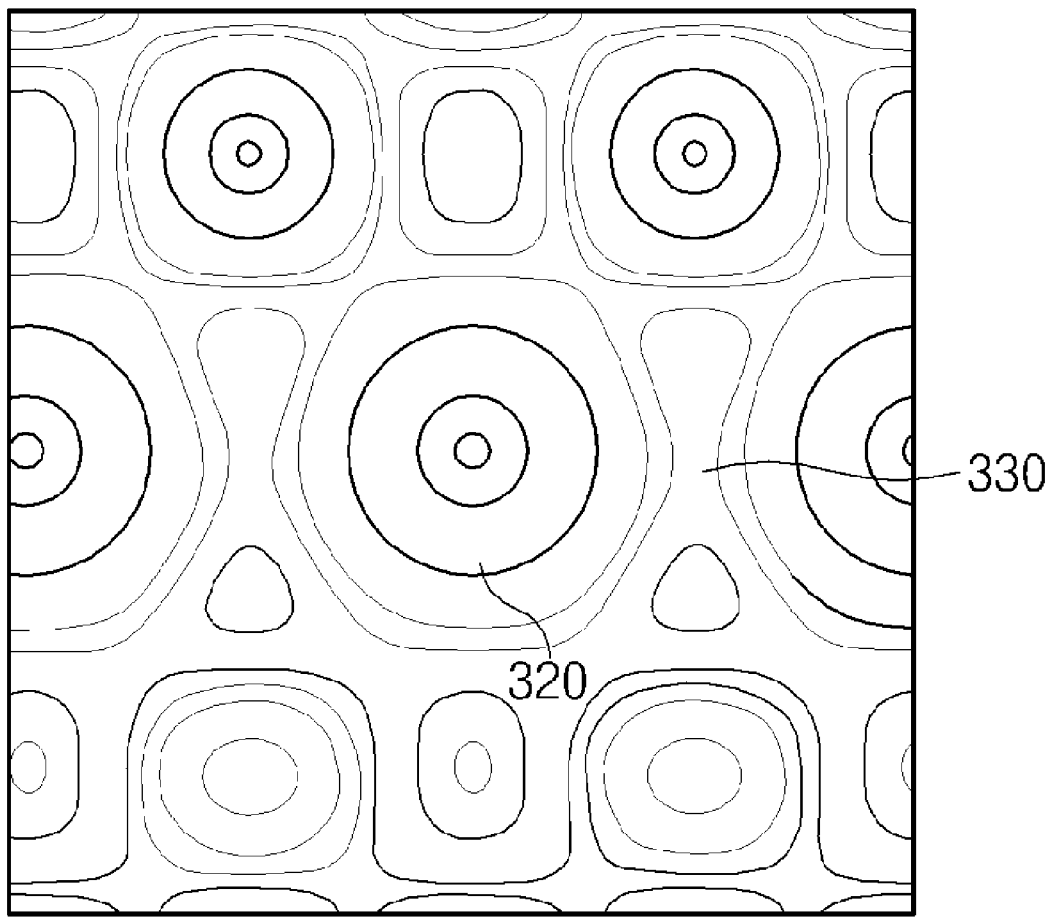

FIG. 6 is a diagram illustrating the aerial image around the outer pattern 320 in FIG. 4a.

Figure 1:
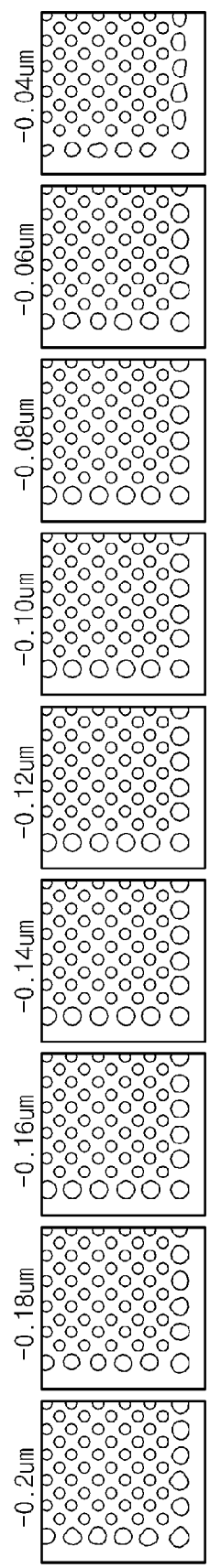
FIG. 1 is a diagram illustrating a SEM photograph of contact holes formed in a cell array region when optical proximity correction is performed without an assistant pattern.
Figure 2:
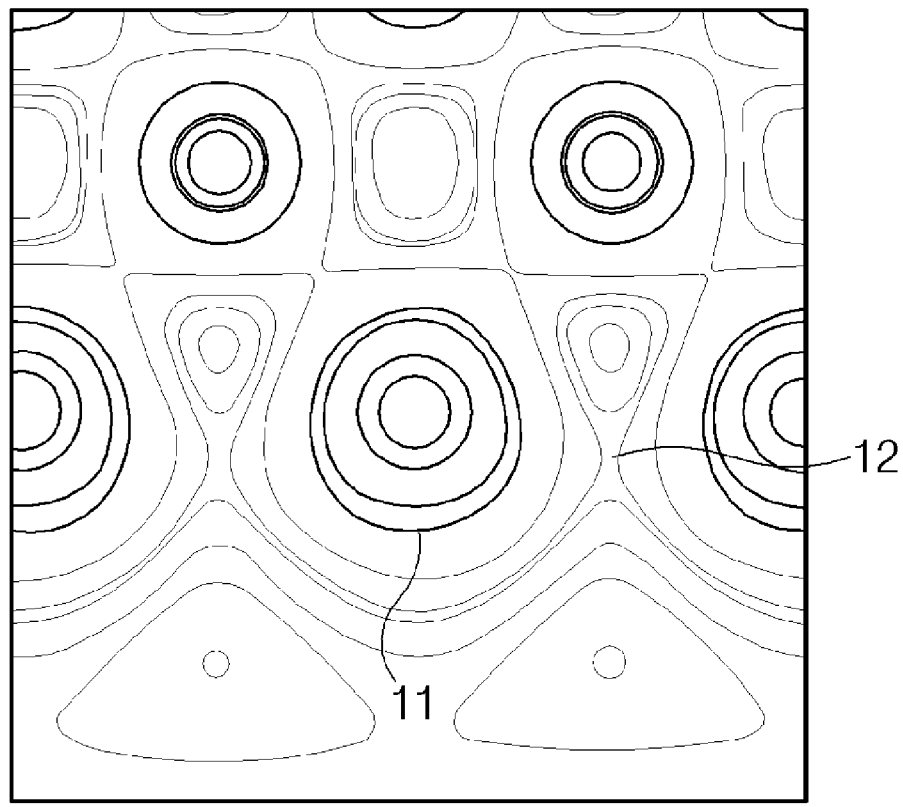
FIG. 2 is a diagram illustrating an aerial image of the contact hole pattern of FIG. 1 in the best focus.

As shown in the aerial image 330 formed between the contact holes 320 of the outer pattern of FIG. 6, the possibility of generation of bridges between the adjacent contact holes 320 is lowered in comparison with FIG. 2.

Figure 7:
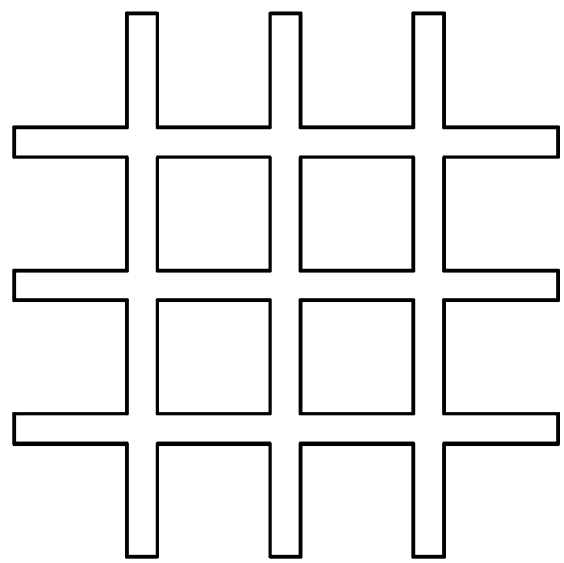
FIG. 7 is a diagram illustrating assistant patterns according to another embodiment of the present invention.
Figure 7:
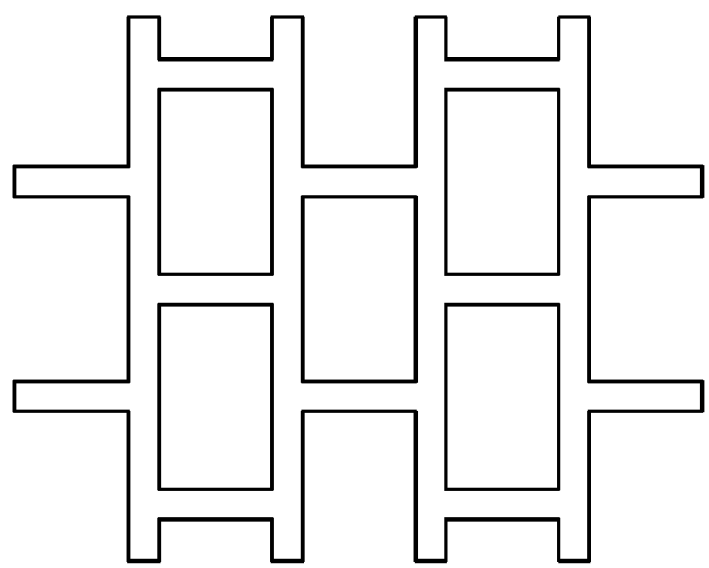

FIG. 7 is a diagram illustrating assistant patterns according to another embodiment of the present invention.

The assistant pattern of FIG. 3 includes diagonal line patterns 210 which are crossed to have a net shape. However, the assistant pattern may be formed to include line patterns arranged in a horizontal and vertical direction to have a checker board shape (the pitch depends on the shape of the main pattern 110) as shown in 7a, or a brick wall shape as shown in FIG. 7b. The brick wall shape means a shape of bricks which are laid like a wall.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A photomask comprising:
   a main pattern formed over a substrate by photolithography;
   a dummy pattern formed over the substrate by photolithography and disposed outside of the main pattern; and
   an assistant pattern symmetrical to the main pattern, the assistant pattern having a critical dimension smaller than the critical dimension of the main pattern and the dummy pattern such that a process that transfers the main pattern and the dummy pattern does not transfer the assistant pattern to a photoresist.

2. The photomask according to claim 1, wherein the assistant pattern is symmetrical to the main pattern while the dummy pattern is formed over a center portion of the substrate between the assistant pattern and the main pattern.

3. The photomask according to claim 1, wherein the assistant pattern includes a plurality of first lines and a plurality of second lines that form a net shape.

4. The photomask according to claim 3, wherein the plurality of first lines have a slope that is substantially the same as a slope of a first set of the main pattern and the plurality of second lines have a slope that is substantially the same as a slope of a second set of the main pattern.

5. The photomask according to claim 3, wherein the assistant pattern is formed to have the same distance between the adjacent crossed points of the first lines and the second lines as the pitch of the main pattern.

6. The photomask according to claim 5, wherein the assistant pattern has the same X direction pitch as Y direction pitch between the adjacent crossed points.

7. The photomask according to claim 1, wherein the assistant pattern includes a chrome (Cr) film, a molybdenum (Mo) film and a stacked structure thereof.

8. The photomask according to claim 1, wherein the assistant pattern is a brick wall shaped pattern.

9. The photomask according to claim 1, wherein the assistant pattern is formed in an open region adjacent to the dummy pattern.

10. The photomask according to claim 1, wherein the main pattern and the dummy pattern are contact hole patterns formed repeatedly with a given interval in a cell array region.

11. The photomask according to claim 1, wherein the main pattern and the dummy pattern are optical-proximity-corrected patterns.

12. The photomask according to claim 1, wherein the dummy pattern has a critical dimension larger than that of the main pattern.

13. A photomask, comprising:
    a main pattern including a plurality of first contact hole patterns;
    a dummy pattern disposed adjacent to outer edges of the main pattern, the dummy pattern including a plurality of second contact hole patterns that are larger than the first contact hole patterns; and
    an assistant pattern disposed adjacent to the outer pattern, the assistant pattern including a plurality of lines parallel to the first contact hole patterns.

14. The photomask of claim 13, wherein the plurality of lines intersect with one another forming a plurality of line intersections which are symmetrical to the plurality of first contact hole patterns.

* * * * *